United States Patent [19]
Mudge et al.

[11] 3,979,612
[45] *Sept. 7, 1976

[54] V-GROOVE ISOLATED INTEGRATED CIRCUIT MEMORY WITH INTEGRAL PINCHED RESISTORS

[75] Inventors: John L. Mudge, Los Altos; Jerry W. Zimmer, Mountain View; Keith G. Taft, Ben Lomond, all of Calif.

[73] Assignee: Raytheon Company, Lexington, Mass.

[ * ] Notice: The portion of the term of this patent subsequent to June 18, 1991, has been disclaimed.

[22] Filed: Apr. 10, 1975

[21] Appl. No.: 566,889

Related U.S. Application Data

[60] Continuation of Ser. No. 418,152, Nov. 21, 1973, abandoned, which is a division of Ser. No. 242,534, April 10, 1972, Pat. No. 3,818,289.

[52] U.S. Cl. .............................. 307/303; 307/238; 357/50; 357/51; 357/55; 357/60
[51] Int. Cl.² .......................................... H01L 27/04
[58] Field of Search .................. 357/50, 51, 55, 60, 357/48; 307/238, 303

[56] References Cited
UNITED STATES PATENTS

| | | | |
|---|---|---|---|
| 3,482,111 | 12/1969 | Gunderson et al. | 357/48 |
| 3,541,531 | 11/1970 | Iwersen et al. | 307/238 |
| 3,631,309 | 12/1971 | Myers | 357/48 |
| 3,659,160 | 4/1972 | Sloan et al. | 357/50 |
| 3,818,289 | 6/1974 | Mudge et al. | 357/50 |

*Primary Examiner*—William D. Larkins
*Attorney, Agent, or Firm*—Richard M. Sharkansky; Milton D. Bartlett; Joseph D. Pannone

[57] ABSTRACT

A semiconductor integrated circuit having microminiature active and/or passive elements in which a crystallographic surface of a semiconductor body lies in the [100] crystallographic plane and anisotropically etched regions with sloped [111] crystallographic surface walls isolate adjacent semiconductor elements and/or define the boundaries of junctions and/or resistance regions formed in an epitaxial layer of said semiconductor body. The structure enables a subsurface region of the epitaxial layer to act as the dispersed collector of a transistor having a plurality of emitters and a subsurface epitaxial resistance interconnecting collector regions under different emitters such that one of the emitters acts with the collector and base as a transistor fed from a power supply through a relatively low resistance while the other emitter acts with the common base and a portion of the collector fed from the relatively high epitaxial resistor region beneath the base region to form a relatively low current drain transistor/resistor combination. A plurality of such transistors are cross coupled such that the transistors with high resistances in their collector circuits act as a latching multivibrator and the transistors with the low resistances in their collector circuits act as signal coupling transistors.

7 Claims, 5 Drawing Figures

V-GROOVE ISOLATED INTEGRATED CIRCUIT MEMORY WITH INTEGRAL PINCHED RESISTORS

CROSS REFERENCE TO RELATED APPLICATIONS

This is a continuation of application Ser. No. 418,152 filed Nov. 21, 1973, now abandoned, which is a division of application Ser. No. 242,534 filed Apr. 10, 1972 (now U.S. Pat. No. 3,818,289).

The following applications, both of which are assigned to the same assignee as this invention, are hereby made a part of this disclosure:

Application Ser. No. 563,429 filed Mar. 31, 1975 as a continuation of application Ser. No. 401,319 filed Sept. 27, 1973 (now abandoned), as a continuation of application Ser. No. 242,457 filed Apr. 10, 1972 (now abandoned) by Wilhelm H. Legat, Keith G. Taft and Karl H. Tiefert, entitled "Integrated Circuit Isolation Structure and Method of Manufacture"; and application Ser. No. 582,941 filed June 2, 1975, now U.S. Pat. No. 3,947,298 issued Mar. 30, 1976 as a continuation of Ser. No. 436,407 filed Jan. 25, 1974, now abandoned, as a division of application Ser. No. 242,512 filed Apr. 10, 1972 (now abandoned) by Karl H. Tiefert, entitled "Sputter Etched Semiconductor Structures and Method of Manufacture".

BACKGROUND OF THE INVENTION

In copending application Ser. No. 401,319, there is disclosed a structure for isolating adjacent semiconductor active and/or passive elements by preferential etching of isolating regions in the semiconductor body. By the use of such isolation, a very substantial reduction in size of the individual semiconductor elements and isolating regions can be achieved over conventional isolation means, such as diffusion isolation and/or oxidation isolation. Such a reduction in size can result in an increased yield of semiconductor integrated circuits from a wafer of a given size since the number of spoiled circuits resulting from imperfections in the wafer is reduced as the overall size of the integrated circuit is reduced. Among the factors which contribute to the total area required for an individual element, such as the memory cell of a large scale integrated circuit, are the emitter, base, and collector contact areas, the isolation regions, the passive element regions, such as resistors, and the contact areas for such resistors. Resistors formed by diffusion from the surface of the semiconductor body through mask openings have been preferred for production purposes since the dimensional area of the resistors can be relatively accurately controlled by means of the mask opening and the total value of the resistor can be controlled by control of the duration temperature and impurity content of the diffusing process. However, such resistors generally require a large area because they are of lower resistance material than the epitaxial layer into which they are diffused and, hence, generally require relatively large areas of the surface of the semiconductor body.

SUMMARY OF THE INVENTION

This invention discloses that the microminiaturized active semiconductor elements, which may be formed in a semiconductor body by the use of preferentially etched isolation zones between the elements, require less current to operate than corresponding elements of conventional integrated circuits for equal performance and, hence, the power dissipation in the resistance regions may be substantially reduced. As a result, the epitaxial layer formed on the substrate may be used to define the resistors and the limits of such resistors may also be accurately defined by preferentially etching channels along the edges of the resistors.

In addition, this invention discloses that a substantial portion of the resistances in certain semiconductor circuits may be made up of the portion of the eqitaxial layer beneath a diffused base region which has boundaries terminating, at least in part, in the etched regions, thereby resulting in a still higher resistance per unit area of the semiconductor body surface.

More specifically, a silicon wafer of P-type material, having [100] crystallographic surfaces has an N-type collector region epitaxially grown thereon. P-type base regions are mask diffused partially through said epitaxial layer and regions of said epitaxial layer are anisotropically etched from said [100] crystallographic surface down to, and slightly into, the original P-type silicon wafer which acts as a supporting substrate. Since anisotropic etching proceeds along the <100> crystallographic axis, which is perpendicular to the epitaxial surface, at a higher rate than in any other direction, very uniformly etched regions may be formed with the walls of said regions lying substantially in the [111] crystallographic surface planes. Because the etched regions slope at a constant uniform angle of, for example, 54° to 56°, with respect to the surface, any area parallel to the surface at any depth below the surface, which is defined between walls of the etched regions, may be controlled accurately by the size of openings in the preferential etching mask. By positioning the mask apertures to etch regions exposing portions of the junctions between the base regions and the collector regions, those collector regions below the base regions may have their area parallel to the surface accurately controlled and, hence, their lateral resistance between adjacent portions of active elements, such as adjacent emitter regions of a multi-emitter transistor, is accurately controlled. Therefore, by controlling the diffusion process steps, the value of the resistance between such emitter regions may be accurately and reproducibly controlled in large scale production. By positioning a base contact between the emitter regions, and by proper choice of the spacing between the emitter regions as well as the width of the transistor between the etched isolation regions, any desired resistance and/or other circuit configuration may be achieved.

This invention further discloses that by the use of a contact to the substrate, the regions of transistors comprising the base contact, the collector region, and the substrate become a PNP transistor, which can be used to assist in substantially preventing the NPN transistor regions from becoming excessively saturated during operation of the circuitry, thereby resulting in high speed operation of the circuits over a wide range of temperatures and power supply voltages.

Because the resistance is positioned largely beneath the transistors, the surface area on the semiconductor body needed for the resistance elements is substantially reduced, thereby further reducing the total size of unit and resulting in a smaller chip size for a given number of circuits of an integrated circuit. For example, in accordance with this invention, a chip having 1024-bits in a bipolar memory, together with associated addressing circuitry and coupling circuitry for coupling data into and out of the memory, may be formed on a chip having a size of about 90 × 120 mils, so that 300 or more individual integrated circuit chips may be formed from a standard 2-inch diameter wafer. Of this area, the memory cells themselves take slightly more than 6 square mils per cell, with the remainder of the chip surface being used for addressing circuits and bonding pads for connecting leads to the chip.

The reduction in area allows a 1024-bit memory chip to be of substantially the same size as a previous 64-bit memory chip and, hence, the same range of production yields of 10 to 80 percent is possible. This results from the fact that a major source of chip defects are defects in the wafer surface, either due to the original wafer slice or to imperfections in processing. For example, if a wafer has 100 defects across the face of the wafer and produces only 100 chips, well over half of the chips will have defects therein, most of which result in a spoiled chip. On the other hand, if 300 chips are produced from a given wafer area having 100 surface defects, less than 25% of the chips will, on a statistical basis, contain one or more of the defects. In addition, since a large portion of the cost of semiconductor systems resides in the cost of interconnecting the individual elements of integrated circuits with elements of other integrated circuits, the more elements which can be formed on a single chip with economically feasible production yields, the lower the final cost per element in the system.

DESCRIPTION OF THE DRAWINGS

Other and further objects and advantages of this invention will become apparent as the description thereof progresses, reference being made to the accompanying drawings wherein.

DESCRIPTION OF THE PREFERRED EMBODIMENT

Figure 1:
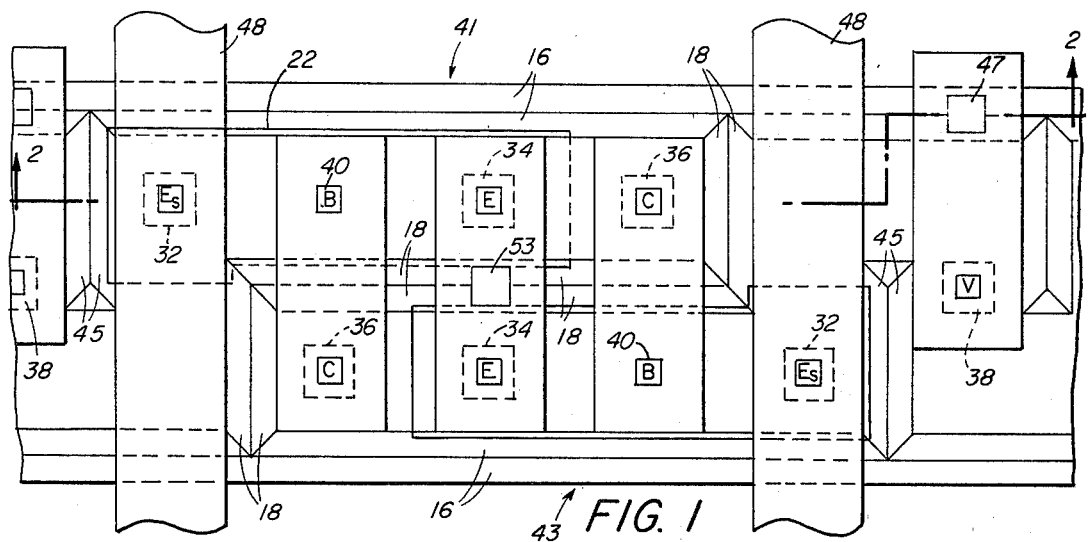
FIG. 1 illustrates a plan view of a portion of an integrated circuit chip illustrating a memory cell embodying the invention with the final set of interconnecting wires removed.
Figure 2:
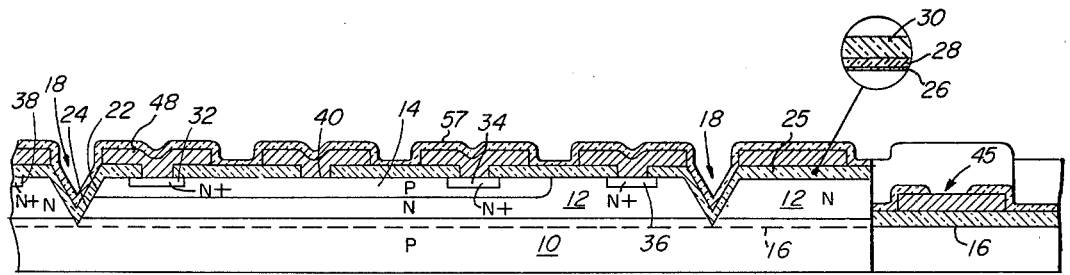
FIG. 2 illustrates a cross-sectional view of the structure of FIG. 1 taken along line 2—2 of FIG. 1.

Referring now to FIGS. 1 and 2, there is shown a semiconductor substrate 10 which is a portion of a wafer of semiconductor material sliced from an ingot grown along the <100> crystallographic axis. Preferably, body 10 is of P-type material, such as silicon, doped with boron to a concentration greater than $10^{16}$ carriers per cubic centimeter and preferably having a bulk resistance on the order of 1 ohm centimeter. This resistance is made sufficiently low to minimize the inversion of the regions in the body 10 under the influence of electric fields which might destroy the isolation between elements formed in a layer deposited on the body 10.

An N-type epitaxial layer 12, approximately 2 and one-half microns thick, is formed on the surface of body 10, in accordance with well-known practice. If desired, regions on the chip, which are to be used for other purposes, may have high conductivity regions deposited in body 10 by diffusion through an oxide mask, in accordance with well-known practice, for use as subcollector regions. While in the particular embodiment of the cell disclosed herein such regions are not required, other circuits on the chip preferably use such subcollectors and it should be clearly understood that the principles of this invention are useful with structures using diffused subcollector regions with or without contacts made directly thereto.

The resistance of layer 12 preferably is substantially lower than the resistance of region 10. For example, the impurity concentration of layer 12 is preferably somewhat greater than $10^{16}$ carriers per cubic centimeter and layer 12 preferably has a bulk resistance of 0.25 to 0.5 Ω-cm.

Diffused into epitaxially grown region 12 are a plurality of base regions 14 which preferably are diffused through an oxide mask, in accordance with well-known practice, to a depth of approximately 1 micron and which preferably have a surface resistance on the order of 650 ohms per square centimeter. While, as illustrated herein, the regions 14 form the bases of a pair of elongated transistors whose elongated regions are parallel to each other, any desired configuration of transistor or other semiconductor elements can be formed in accordance with this invention.

A plurality of longitudinal grooves 16 are preferentially etched through layer 12 and into substrate 10. Grooves 16 are formed by masking the surface of the body with oxide, opening windows in a photoresist layer over the desired regions to be preferentially etched, and removing the oxide in the windows. The photoresist is then stripped off and a preferential etching solution, such as a solution of sodium hydroxide, potassium hydroxide, or any other variety of organic solutions which etch silicon substantially faster along the <100> crystallographic axis than in any other direction, are applied through the apertures in the oxide mask. Etching is allowed to proceed until a V-shaped groove is formed, which preferably extends slightly into substrate 10, at which time etching substantially ceases since the sides of groove 16 lie in [111] crystallographic surface planes, and the etch proceeds perpendicular to these planes at an extremely slow rate. As indicated herein, a plurality of grooves 18, preferentially etched at the same time as grooves 16, form an S-shaped pattern connecting adjacent parallel grooves 16 and separating the semiconductor cell into two sections, each section having a transistor and associated resistors connected thereto. The grooves 16 and 18 expose portion 22 of the junction between the N-type layer 12 and the P-type base regions 14, as well as portions of the junction 24 between the substrate 10 of P-type material and the N-type epitaxial layer 12. Because of the anisotropic etch forming of grooves produces flat walls having a predetermined angle of, for example, 54° to 56° with respect to the surface of the semiconductor body, the dimensions across the regions 14, parallel to the [100] surface, are accurately controlled by the positioning and size of the apertures in the mask used for the preferential etching. As illustrated herein, the width of the openings in the mask used to form the grooves 16 and 18 are sufficient to cause said grooves to penetrate between one-half micron and 1 micron into the substrate 10, thereby producing sufficient spacing between the portions of the layer 12 on opposite sides of the said grooves to prevent conduction between such portions through inversion in the substrate 10 around the apexes of said grooves. The amount of penetration required depends on the circuit application and the value of resistance of the substrate 10 since higher resistance values would normally require a deeper penetration into the substrate 10 to prevent such conduction under all conditions of operation of the circuit.

Positioned on the surface of the structure is an insulating layer 25 which is substantially transparent and is made up of a first layer 26 of thermally grown oxide, preferably 500 Angstroms or so thick, a second layer 28 of silicon nitride deposited by chemical vapor deposition and having a depth of approximately 1500 Angstroms, and a third layer 30 of silicon dioxide deposited by chemical vapor deposition, in accordance with well-known practice, and having a depth preferably on the order of 8000 Angstroms.

Diffused into each of the base regions 14 are a plurality of N+ emitter-junction regions 32 and 34 and diffused into layer 12 are N+ ohmic collector contact regions 36 and resistor contact regions 38. Ohmic base contact regions 40 are formed in the base regions 14.

Regions 32, 34, 36, 38 and 40 are formed by exposing the surface regions of layer 30 through which contacts are to be made through a photoresist mask and etching the exposed regions with a buffered hydrogen fluoride solution to expose the silicon nitride layer 28. The silicon nitride region over contact 40 is then coated with photoresist.

The regions 32, 34, 36 and 38 are etched with a solution of phosphoric acid to remove the silicon nitride layer 28. The exposed oxide layer 26, beneath the nitride layer, is then removed by a hydrogen fluoride solution and the photoresist layer is then stripped off. Regions 32, 34, 36 and 38 are then diffused into the semiconductor body by any desired well-known process. For example, a phosphorus-type impurity may be diffused into these regions to form N+ regions having a surface resistance preferably on the order of 12 ohms per square centimeter. Due to the oxidizing atmosphere employed in the diffusion process, a layer of oxide several hundred Angstroms thick grows over the surface of the regions 32, 34, 36 and 38.

The silicon nitride layer over the base contact regions 40 is then removed by etching with a solution of phosphoric acid in accordance with well-known practice, which also removes a few hundred Angstroms of the oxide layer which have grown over the regions 32, 34, 36 and 38, or regions 32, 34, 36 and 38 may be covered with a photoresist mask with openings over the regions 40 during the phosphoric acid etch.

The remaining oxide over all of the contact areas 32, 34, 36, 38 and 40 is removed by any desired means, such as washing with a hydrogen fluoride solution, or, more preferably, by sputter washing the areas in a reduced atmosphere of argon in accordance with the teaching of copending application (application Ser. No. 436,407).

The emitter, collector, base and resistor contact regions are now metalized by any desired process. Preferably, the metalization is achieved by depositing a coating of platinum by a sputtering process, more completely described in the aforementioned application (application Ser. No. 436,407), and heating the silicon body to form platinum silicide in the contact areas. The excess platinum may then be removed by etching with aqua regia.

Figure 3:
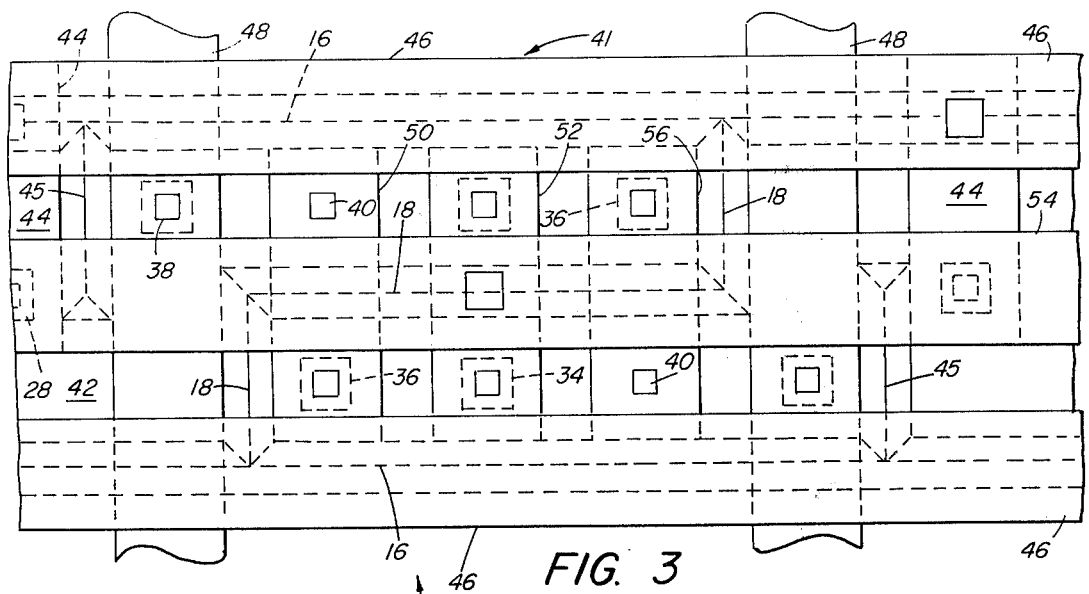
FIG. 3 illustrates a plan view of the structure of FIG. 1 with the final interconnecting conductors in place.

Referring now to FIG. 3, there is shown a plan view of the structure of FIG. 1 with the metalization layers in place providing the interconnections for the contacts 32, 34, 36, 38 and 40. As illustrated herein, the upper group of contacts 32, 34, 36 and 40 is connected to one transistor 41, while a lower set of contacts is connected to a second transistor 43.

A portion of the epitaxial layer 12 between emitter contact 32 and resistor contact 38 forms a resistor whose resistance is somewhat increased by reason of an extension 45 of the groove 16 part way into the region between the emitter 32 and the resistor contact 38. The region of layer 12 which acts as the collector portion of the transistor beneath the emitter 32 is therefore closer to the source of voltage supplied to resistor contact 38 then the collector beneath emitter 34. Contact 38 is connected by strap 44 to a horizontal bus 46, which supplies a two-level voltage to the cell. Emitter contact 32 is connected to a vertical bus 48 which senses data stored in the storage cell. Base contact 40 of transistor 41 is connected by means of a vertical strap 50 to the collector contact of transistor 43. Emitter contact 34 of transistor 41 is connected by means of a vertical strap 52 to the corresponding emitter of transistor 43 and to a horizontal bus 54 which can be used as a word enable bus. Collector contact 36 is connected by means of a vertical strap 56 to the base contact of the opposite transistor.

Any desired metalizing system may be used for making the interconnecting straps and buses. For example, the system of titanium platinum and gold, disclosed in the aforementioned patent application Ser. No. 401,319, may be used to form the connections. Specifically, the vertical straps are formed with the first layer of connections over the insulating layers comprising the oxide layer 26, the nitride layer 28, and the oxide layer 30. Following deposition of the first layer, a second set of the interconnectors is deposited over an insulating layer formed across the entire surface covering the first set of conductors. The second set of conductors is shown in FIG. 3 as conductors 46 and 54, which are connected to straps 44 and 52, respectively, through apertures 47 and 53 in the insulating layer 57 between the first and second sets of conductors.

Figure 4:
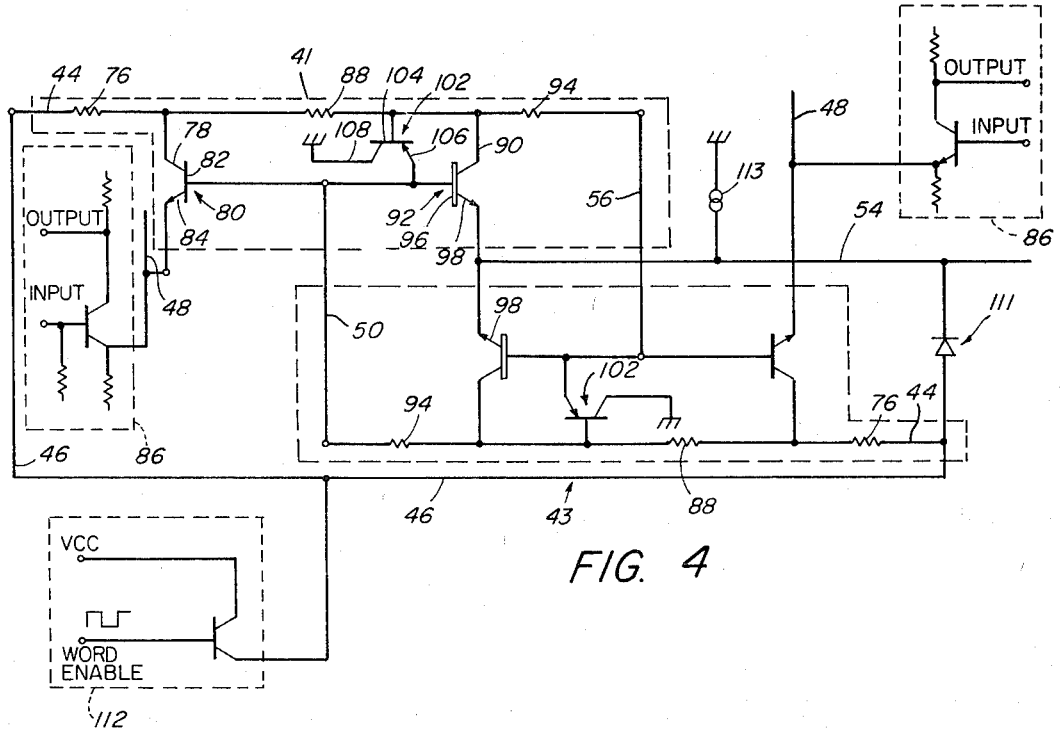
FIG. 4 illustrates a schematic diagram of the circuit of the structure of FIGS. 1 through 3.

Referring now to FIG. 4, there is shown a schematic diagram of the memory cell in which the various components are laid out in the same approximate position as the physical components in FIG. 1. A resistance 76 is connected between strap 44 and the collector 78 of a first transistor section 80 having a base 82 and an emitter 84 forming an NPN transistor. Emitter 84 is connected to the data strap 48 which may be used to write data into the memory cell or read data out of the memory cell. As indicated here, by way of example only, strap 48 is driven by an emitter follower circuit 86 (not shown in the structure of FIGS. 1 through 3) having base emitter and collector load resistors by means of which biases may be applied to the strap 48 and data coupled into and out of the memory cell. A resistor 88 is connected between the collector 78 of transistor section 80 and a collector 90 of a transistor section 92 of transistor 41. Collector 90 is connected via a resistor 94 to a common base connection of the opposite transistor 72. Transistor section 92 has a base 96 which is connected to base 82 and an emitter 98 which is connected to the corresponding emitter of transistor 43 and to a bus 54 by strap 52. The values of the resistors 76, 88, and 94 are controlled by the width and thickness of the epitaxial regions shown in FIGS. 1 and 2. While any desired values may be chosen for these resistors, preferably resistor 76 has a resistance on the order of 6 kilohms, resistor 88 has a resistance on the order of 14 kilohms, and resistance 94, which is the least critical of three resistors, has a resistance on the order of 4 kilohms. The values of these resistors vary with temperature and are chosen to operate effectively over a wide temperature range, such as −55°C to 125°C, and to prevent conditions of substantial saturation of the transistors during operation at the higher end of the range when the transistors have increased current gains and the resistors have increased values.

A PNP transistor 102 has its base 104 connected to collector 90, its emitter 106 connected to bases 82 and 96, and its collector 108, which is formed by substrate 10, connected to a ground terminal 110, which is formed by making a connection to the substrate at various regions around the chip and applying a voltage to the connection which is negative with respect to the collector regions 12. When transistor section 52 is conducting and emitters 84 are not conducting, the voltage drops across the resistors 76, 88 and 94 will result in a voltage at collector 78 of approximately −0.15 volts with respect to strap 44, a voltage at collector 90 of approximately −0.5 with respect to strap 44, and a voltage at the bases 82 and 96 of transistor 43 of −0.5 with respect to strap 44. The bases 82 and 96 of transistor 41 are at about the same potential as strap 44 since transistor 43 is not conducting and has no voltage drop across its resistors 76, 88 and 94. Emitters are maintained at a substantially constant voltage of −0.75 volts with respect to strap 44 by circuit such as the forward diode drop of a diode 111 which is connected between buses 46 and 54.

An emitter-follower circuit 112 (not shown in FIGS. 1 and 2) varies the potential of bus 46 with respect to the grounded positive terminal VCC of the power supply from approximately −1.3 volts for the quiescent or storage state to approximately −2.3 volts during the active state or storing-reading state, while the emitters 84 are maintained at a voltage of about −2 volts by the circuits 86. Emitters 84 are nonconducting in the quiescent state and the emitters 98 are fed through a constant current circuit indicated at 113, from a negative power terminal which is preferably maintained at from −3 to −8 volts with respect to the grounded positive terminal.

To write data into the system a differential voltage is applied between the emitters 84 by means of circuits 86 so that the transistor circuit 86, driving the emitter 84 of the transistor to be turned off, is raised slightly higher than the voltage applied to the emitter 84 of the opposite transistor and the circuit 112 is raised from the quiescent state by about 1 volt above its quiescent state of −2.3 below VCC and the current flows through the emitter 84 of the transistor section 80. When the bus 46 returns to its quiescent state, conduction continues through the transistor, which is turned on by shifting from section 80 to section 92 and flows through emitter 98 while the emitter 98 of the opposite transistor remains off.

To read data stored in the transistor cell, the circuits 86 have their outputs connected to a differential amplifier (not shown) and the bus 46 is raised about 1 volt above its quiescent state by circuit 112. Current then shifts from the emitter 98 of the transistor, which was conducting, to the emitter 84 of the same transistor, causing an output signal in the transistor circuit 86. When bus 46 returns to its quiescent voltage, the emitter 98 of the conducting transistor again produces a flow of current and emitter 84 cuts off without disturbing the storage of information in the cell.

Since the resistance of resistor 88 is several times the value of the resistance of resistor 76 and is in series with the collector 90, the current flow through the emitter 98 during the nonoperating or quiescent time of the cell is a small fraction of the current during the time the cell is being read and/or written into. On the other hand, when the emitter 84 is conducting, a substantial current flows through resistor 76 and the emitter 84 giving sufficient power to supply a useful output signal. By using two circuits 86, one for each half of the cell, a dual output may be used with the circuits 86 feeding two inputs of the differential amplifier (not shown), hence producing the signal in the output which balances out those disturbances on the power supply line and on the data lines which might otherwise cause erroneous signals. Since the resistance 88 is formed by the region beneath the diffused base 14, it occupies no additional space in the transistor layout in FIG. 1, and, in addition, minimizes the number of connections between the parts.

The PNP transistor 102 is made up of the region 14 of FIG. 1 acting as the P-type emitter, the epitaxial layer 12 acting as the base, and the substrate 10 acting as the collector. Since the collector has a reverse bias across it, whenever the transistor 92 attempts to saturate, it produces an emitter current flow in the transistor 102 thereby assisting in preventing any substantial saturation in the transistor 90. The transistor 102 has been discovered to be important in maintaining the high speed operation of the cell over a wide range of temperatures. Heretofore, operation of emitter coupled logic circuits over a wide range of temperatures has required expensive and complex temperature and voltage compensating circuitry and/or close process control, whereas, with the circuit and structure of this invention, a wide temperature and power supply voltage range of operation can be achieved.

In addition, it has been found that when the junction between the region 12 and the base region 14 of the transistor 92 is exposed by preferential etching, terminating in the [111] crystallographic plane, relatively high betas may be achieved with relatively low carrier lifetimes. This eliminates the necessity to use expensive processing, such as gold diffusion, through the substrate to kill carrier lifetime. This, in turn, permits, as a practical matter, production of relatively thin base regions without danger of the gold diffusion poisoning the emitter operation.

Figure 5:
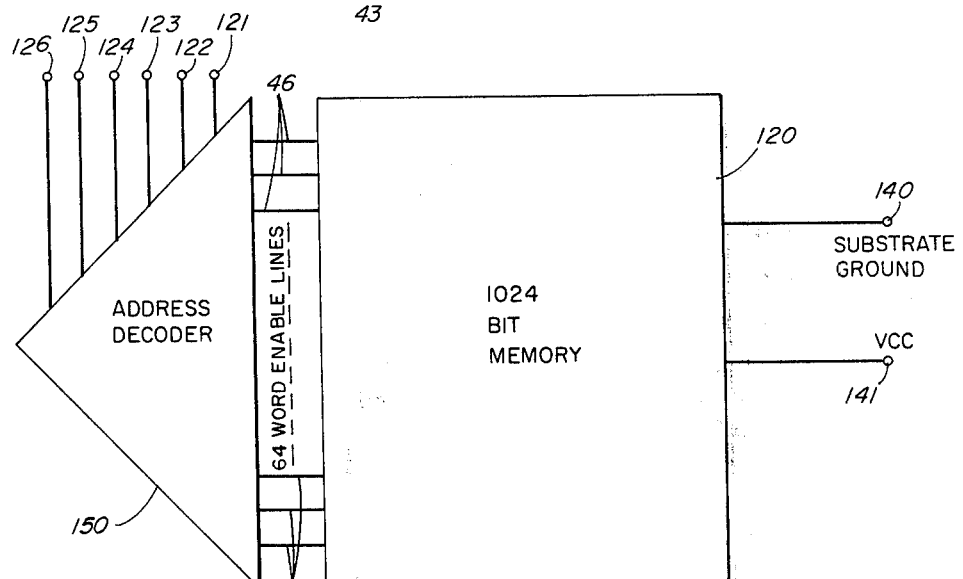
FIG. 5 illustrates a block diagram showing the functions of a complete memory system on a chip having a plurality of the structures illustrated in FIGS. 1 through 3 formed thereon together with associated addressing, data multiplexing, and control logic circuits.
Figure 5:
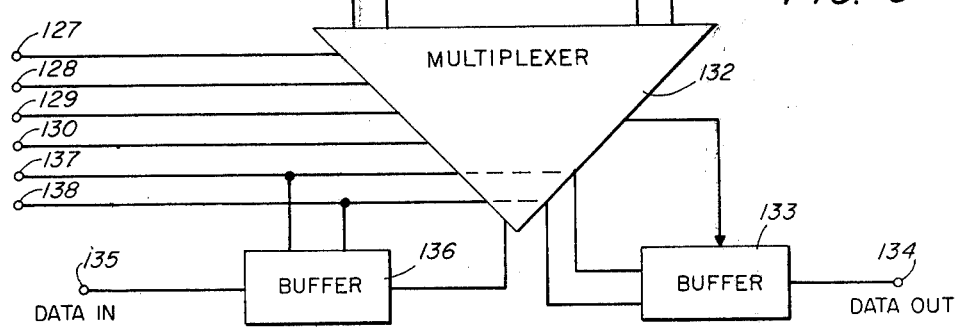

Referring now to FIG. 5, there is shown a block diagram of the logic functions of a complete chip. The memory cell array 120 is organized as a 1024-bit memory having 16 pairs of data straps and 64 pairs of word enable straps. Choice of this aspect ratio results partly from the fact that the individual cells have a relatively greater length than width so that a 16 × 64 layout is approximately square and partly because it is more desirable to use a lesser number of sense amplifiers for the data input and output. Terminals 121 through 126 contain a binary code for 64 addresses and feed an address decoder 150 which decodes the binary code to produce a word signal on one of the 64 word enable straps feeding circuits 46 of FIG. 4. Terminals 127 through 131 supply binary address data to multiplexer 132 which selects 16 pairs of data input and output buses which are connected to the circuits 48. When data is read out of the memory, information flows from the multiplexer 132 through a buffer 133 to an output terminal 134. When data is to be read into the memory, it is fed from an input terminal 135 through a buffer 136 to the multiplexer 132.

A chip enable terminal 137 is used to supply a signal to the memory to select this particular memory from a group of memories associated with a common data bus. If desired, where only one memory chip is used in a system, the chip enable bus may have a constant signal applied thereto. Terminals 137 and 138 have the write enable signal applied thereto from the system to cause the reading or writing function previously described. The general techniques for designing such a logic system are well known and, accordingly, no further description of the particular circuits is necessary. In accordance with this invention, however, all of the conventional circuits used in such circuitry may be placed on the chip with the memory so that there are only 16 connections from the chip to external circuits. Because PNP transistors are used to convert the TTL logic levels to the emitter coupled circuits driving the memory cell, the substrate has connections made thereto to supply a collector potential to the collectors of the PNP transistor and to back bias this substrate to epitaxial layer of isolation between components in the layer.

This completes the description of the particular embodiment of the invention illustrated herein, however, many modifications thereof will be apparent to persons skilled in the art without departing from the spirit and scope of this invention. For example, the memory logic could be PNP logic and could use base and/or collector coupled circuits and the data input and output could be single ended, that is, one of the emitters of one of the sections of each cell could be connected to a constant voltage. Accordingly, it is contemplated that this invention be not limited except as defined by the appended claims.

What is claimed is:
1. An integrated circuit comprising:
   a semiconductor substrate;
   a layer of semiconductor material supported on said substrate having a surface lying in the [100] crystallographic plane;
   a plurality of active elements formed in said layer;
   each of said active elements having emitter base junctions extending along said [100] surface;
   resistive elements connected directly to collector portions of said active elements directly through said semiconductor layer with the major portions of said resistive elements lying between said substrate and base to collector junction regions of said active elements;
   isolation regions extending through said layer along [111] crystallographic surfaces, separating at least portions of said active semiconductor elements, and defining the major portions of the peripheries of said resistive elements;
   means producing a substantially constant voltage bias across a plurality of said active elements connected in series through said layer; and
   at least one of said junctions in said layer forming an emitter base junction of a transistor whose collector junction is formed between said substrate and said layer.

2. The integrated circuit in accordance with claim 1 wherein portions of said [111] crystallographic plane isolation surfaces extend into said substrate.

3. The integrated circuit in accordance with claim 2 wherein said isolation regions are preferentially etched from said [100] crystallographic surface along [111] crystallographic surface planes toward said substrate.

4. The integrated circuit in accordance with claim 3 wherein said active elements comprise a plurality of transistor collectors interconnected by one of said resistive regions of said layer.

5. The integrated circuit in accordance with claim 1 wherein said integrated circuit comprises a plurality of bipolar memory cells.

6. The integrated circuit in accordance with claim 5 wherein the major portions of the peripheries of said resistive elements are bounded by [111] crystallographic surface planes of said isolation regions.

7. The integrated circuit in accordance with claim 1 wherein said integrated circuit comprises a plurality of memory cell circuits formed at least in part from series connected passive and active elements coupled to means for shifting the potentials of the emitters of said cells with respect to a data channel reference voltage.

* * * * *